United States Patent
Maruyama (10) Patent No.: US 9,254,608 B2
(45) Date of Patent: Feb. 9, 2016

(54) IMPRINT APPARATUS, IMPRINT METHOD, AND METHOD OF MANUFACTURING ARTICLE

(71) Applicant: CANON KABUSHIKI KAISHA, Tokyo (JP)

(72) Inventor: Naoki Maruyama, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 419 days.

(21) Appl. No.: 13/875,435

(22) Filed: May 2, 2013

(65) Prior Publication Data

US 2013/0313744 A1 Nov. 28, 2013

(30) Foreign Application Priority Data

May 22, 2012 (JP) ................. 2012-116914

(51) Int. Cl.
*B29C 59/02* (2006.01)
*G03F 7/00* (2006.01)

(52) U.S. Cl.
CPC ........... *B29C 59/026* (2013.01); *G03F 7/0002* (2013.01)

(58) Field of Classification Search
CPC ................... G03F 7/70725; G03F 7/70775
See application file for complete search history.

(56) References Cited

U.S. PATENT DOCUMENTS

| 6,151,120 A * | 11/2000 | Matsumoto ........... G03F 9/7084 356/399 |
| 2009/0108483 A1* | 4/2009 | Suehira ................. B82Y 10/00 264/40.5 |
| 2009/0284724 A1* | 11/2009 | Kanaya ............... G03F 7/70775 355/53 |

FOREIGN PATENT DOCUMENTS

| JP | 4185941 B2 | 11/2008 |
| KR | 20090111562 A | 10/2009 |

* cited by examiner

*Primary Examiner* — Ryan Ochylski
(74) *Attorney, Agent, or Firm* — Rossi, Kimms & McDowell LLP

(57) ABSTRACT

The present invention provides an imprint apparatus which performs an imprint process in which a resin on a substrate is cured, in a contact state in which a mold is kept in contact with the resin, to transfer a pattern onto the substrate, the apparatus including a stage configured to move upon holding the substrate, a detection unit configured to detect a first mark formed on the mold, and a second mark formed on the substrate, and a processing unit configured to perform alignment of the mold and the substrate in the contact state.

10 Claims, 7 Drawing Sheets

IMPRINT APPARATUS, IMPRINT METHOD, AND METHOD OF MANUFACTURING ARTICLE

BACKGROUND OF THE INVENTION

1. Field of the Invention

The present invention relates to an imprint apparatus, an imprint method, and a method of manufacturing an article.

2. Description of the Related Art

The imprint technique can transfer a nanoscale fine pattern, and is known as a nanolithography technique for volume production of semiconductor devices and magnetic storage media. An imprint apparatus which employs the imprint technique cures a resin (imprint material) on a substrate while a mold (original) having a pattern formed on it is pressed against the resin to transfer the pattern onto the substrate, as disclosed in Japanese Patent No. 4185941.

In the photo-curing method as one method of curing the resin on the substrate, an ultraviolet-curing resin is irradiated with ultraviolet light while a transparent mold is kept in contact with the resin to cure the resin, and the mold is separated (released) from the cured resin. The photo-curing method is suitable for manufacturing a semiconductor device and a magnetic storage medium because, for example, the temperature can be controlled relatively easily, and an alignment mark formed on the substrate can be detected through the transparent mold.

Also, an imprint apparatus generally adopts the die-by-die alignment scheme as a scheme of alignment between a substrate and a mold. In the die-by-die alignment scheme, for each of a plurality of shot regions on the substrate, an alignment mark formed in the shot region on the substrate is optically detected to correct a shift in positional relationship between the mold and the substrate.

However, in an imprint apparatus, a mold is kept in contact with a substrate through a resin. Therefore, in, for example, pressing the mold against the resin on the substrate, a force acts not only in the direction (perpendicular direction) in which the mold is pressed, but also in the horizontal direction (the direction in which the position of the mold is shifted) perpendicular to the pressing direction. Also, disturbance vibration acts on the mold and the substrate from a structure which holds the mold, and that which holds the substrate, respectively. As a result, the mold is pressed while the positional relationship between the mold and the substrate has changed, that is, pressed at a position shifted from a predetermined position. In other words, even when the mold and substrate are aligned with high accuracy before the mold is pressed against the resin on the substrate, the mold and substrate do not always have a predetermined positional relationship while the mold is pressed. Also, after the mold is pressed against the resin on the substrate, a resin (thin film resin) with tribological properties, that is, a so-called frictional force acts between the mold and the substrate, and this makes it difficult to finely adjust the relative position between the mold and the substrate.

In an imprint apparatus, to improve the pattern transfer accuracy (resolution) while suppressing in-plane variations between shot regions, it is necessary to minimize the film thickness of the resin on the substrate. Also, to shorten the time to fill the mold with the resin, and reduce the force (release force) required to release the mold, a cavity (air chamber) is formed at the central portion of the back surface of the mold (its surface opposite to the pattern surface) to be thinner than the peripheral portion of this surface. Moreover, a soft member is provided on a mold holding unit (holding surface), which holds the mold, along the tilt of the substrate. In this manner, a mold and mold holding unit used in an imprint apparatus are prone to deformation in reaction to an external force. Therefore, the mold and mold holding unit deform due, for example, to the frictional force of the resin on the substrate, and this makes it difficult to align the mold and the substrate with high accuracy (especially, align them in the horizontal direction perpendicular to the pressing direction).

SUMMARY OF THE INVENTION

The present invention provides a technique advantageous in terms of the accuracy of alignment between a mold and a substrate.

According to one aspect of the present invention, there is provided an imprint apparatus which performs an imprint process in which a resin on a substrate is cured, in a contact state in which a mold is kept in contact with the resin, to transfer a pattern onto the substrate, the apparatus including a stage configured to move upon holding the substrate, a detection unit configured to detect a first mark formed on the mold, and a second mark formed on the substrate; and a processing unit configured to perform alignment of the mold and the substrate in the contact state, wherein the processing unit performs the alignment by a first process of moving the stage in a first direction in which the first mark and the second mark come close to using, as a target moving distance, a distance obtained by adding to a moving distance of the stage, which is required for the alignment, an additional distance determined in accordance with an amount of position shift between the first mark and the second mark detected by the detection unit, and a second process of moving the stage in a second direction opposite to the first direction by a distance smaller than the target moving distance determined in accordance with the additional distance after the first process.

Further features of the present invention will become apparent from the following description of exemplary embodiments with reference to the attached drawings.

DESCRIPTION OF THE EMBODIMENTS

Preferred embodiments of the present invention will be described below with reference to the accompanying drawings. Note that the same reference numerals denote the same members throughout the drawings, and a repetitive description thereof will not be given.

Figure 1:
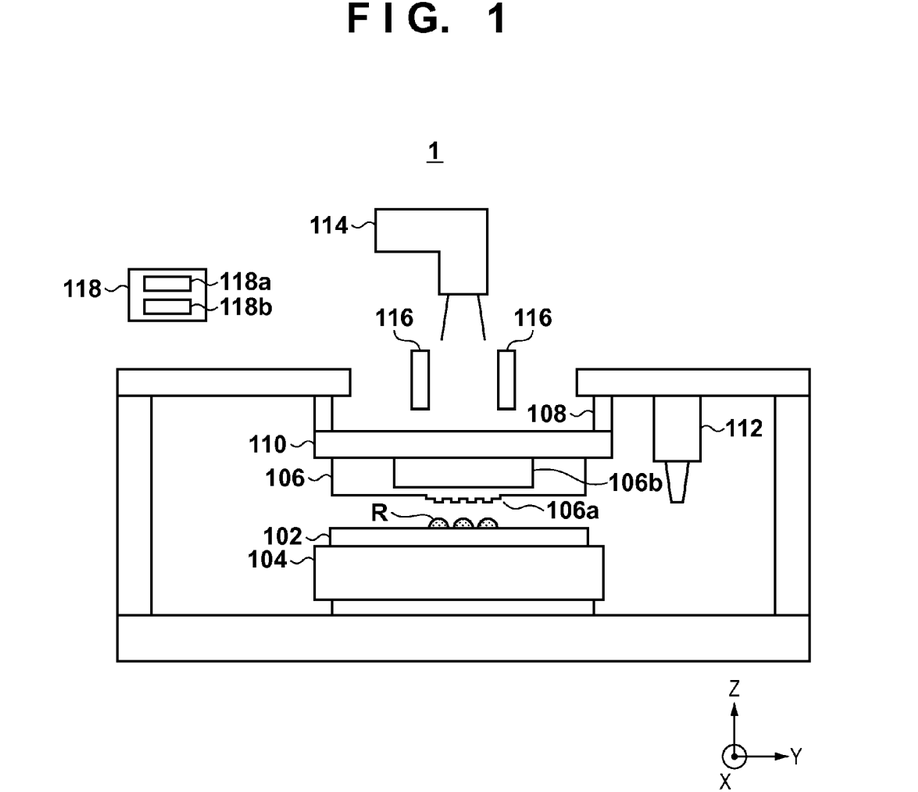
FIG. 1 is a schematic view showing the configuration of an imprint apparatus according to an aspect of the present invention.

FIG. 1 is a schematic view showing the configuration of an imprint apparatus 1 according to an aspect of the present invention. The imprint apparatus 1 serves as a lithography apparatus which cures a resin (imprint material) on a substrate, in the contact state in which a mold (original) is kept in contact with the resin, to transfer a pattern onto the substrate. Although the imprint apparatus 1 adopts the photo-curing method in which a resin (ultraviolet-curing resin) is cured by irradiating it with light (ultraviolet rays) in this embodiment, it may adopt other curing methods such as the heat-curing method in which the resin is cured by applying heat to it.

The imprint apparatus 1 includes a substrate stage 104, mold holding unit 108, resin supply unit 112, light source 114, detection unit 116, and control unit 118, as shown in FIG. 1.

The substrate stage 104 includes a substrate chuck (not shown) which chucks a substrate 102 by suction, and moves upon holding the substrate 102. The substrate stage 104 has a function of adjusting the position of the substrate 102 in the horizontal direction (X- and Y-directions), the position of the substrate 102 in the vertical direction (Z-direction), the position of the substrate 102 in a rotation direction about the Z-axis, and the tilt of the substrate 102. The substrate 102 is a substrate onto which the pattern of a mold 106 is to be transferred, and includes, for example, a single-crystal silicon wafer and an SOI (Silicon ON Insulator) wafer.

The mold holding unit 108 holds the mold 106 through a mold chuck 110 which fixes the mold 106. The mold 106 includes a pattern surface 106a on which a three-dimensional pattern to be transferred onto the substrate 102 is formed, and is made of a material (for example, quartz) which transmits light from the light source 114. A cavity (air chamber) 106b is formed at the central portion of the surface of the mold 106, which is opposite to the pattern surface 106a, to be thinner than the peripheral portion of the former surface. The mold chuck 110 includes an aperture portion (not shown) through which light from the light source 114 passes. The mold holding unit 108 includes an actuator which vertically drives the mold 106, and presses the mold 106 (its pattern surface 106a) fixed to the mold chuck 110 against the substrate 102 (a resin R on its surface), or separates the mold 106 from the substrate 102.

The resin supply unit 112 includes a dispenser head including nozzles which discharge the resin R, and supplies the resin R onto the substrate 102. By, for example, movement (scan movement or step movement) of the substrate stage 104 while the resin R is supplied from the resin supply unit 112, the resin R can be applied onto the substrate 102 (its shot region).

The light source 114 emits light to cure the resin R on the substrate 102. However, when the imprint apparatus 1 adopts the heat-curing method, the light source 114 is exchanged with a heater which heats a heat-curing resin.

The detection unit 116 is implemented by, for example, a scope which optically detects (observes) a mark, and detects first marks (alignment marks) MK1 formed on the mold 106, and second marks (alignment marks) MK2 formed on the substrate 102. In other words, the detection unit 116 detects the relative positional relationship between the first mark MK1 and the second mark MK2 to obtain the amount of position shift (the amount of horizontal position shift) between the mold 106 and the substrate 102.

The control unit 118 includes, for example, a CPU 118a and memory 118b, and controls the overall imprint apparatus 1 (each unit of the imprint apparatus 1). In other words, the control unit 118 controls an imprint process and processes involved. In an imprint process, the control unit 118 functions as, for example, a processing unit which aligns the mold 106 and substrate 102 in the contact state in which the mold 106 is kept in contact with the resin R on the substrate 102.

Figure 2:
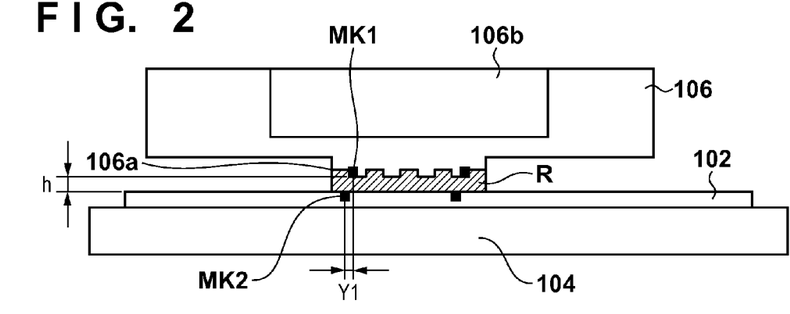
FIG. 2 is a schematic view showing the vicinities of a mold and substrate in the contact state between a resin and the mold in the imprint apparatus shown in FIG. 1.

FIG. 2 is a schematic view showing the vicinities of the mold 106 and substrate 102 in the contact state between the resin R and the mold 106. In bringing the mold 106 into contact with the resin R, first, the resin supply unit 112 supplies the resin R onto the substrate 102. Then, the substrate stage 104 is moved so that the substrate 102 (its shot region) is positioned directly below the mold 106, and the mold 106 is pressed against the resin R on the substrate 102 by the mold holding unit 108. With this operation, the recesses in the pattern surface 106a of the mold 106 are filled with the resin R. Also, in pressing the mold 106 against the resin R, the resin R in the space between the mold 106 and the substrate 102 is formed with a predetermined film thickness h. The predetermined film thickness h is set small on the order of nm, and set to, for example, 20 nm or less.

The first marks MK1 used for alignment with the substrate 102 are formed on the pattern surface 106a of the mold 106, as shown in FIG. 2. Similarly, the second marks MK2 used for alignment with the mold 106 are formed on the substrate 102 (its shot region) by the previous imprint process or photolithography.

Even when the mold 106 and substrate 102 are aligned with high accuracy before the mold 106 is pressed against the resin R, a position shift occurs between the mold 106 and the substrate 102, as shown in FIG. 2, in the contact state between the resin R and the mold 106. This occurs due to the influence of, for example, friction between the mold 106 and the resin R, or disturbance vibration generated by the structure (for example, the mold holding unit 108) which holds the mold 106, or that (for example, the substrate stage 104) which holds the substrate 102. Note that the amount of position shift between the mold 106 and the substrate 102, that is, the amount of position shift between the first mark MK1 and the second mark MK2 is defined as Y1.

Figure 3:
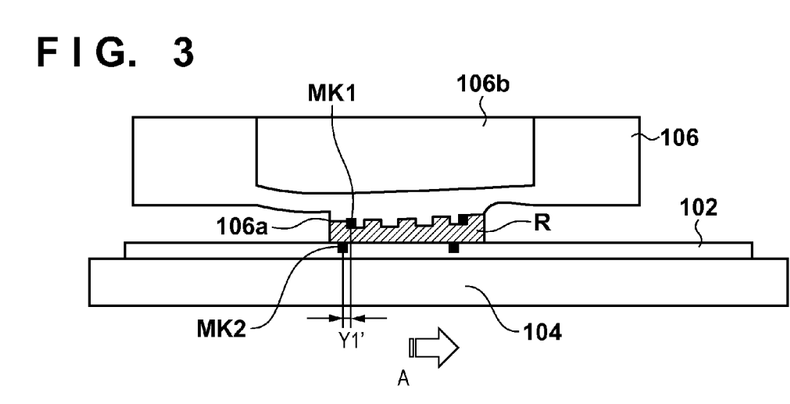
FIG. 3 is a schematic view showing the vicinities of the mold and substrate in the contact state between the resin and the mold in the imprint apparatus shown in FIG. 1.

FIG. 3 is a schematic view showing the vicinities of the mold 106 and substrate 102 when the substrate stage 104 is moved by a relatively short distance in the direction, in which the relative distance between the first mark MK1 and the second mark MK2 shortens, with respect to the positional relationship between the mold 106 and the substrate 102, shown in FIG. 2. At this time, the distance across which the substrate stage 104 is moved is the moving distance of the substrate stage 104, which is required to align the mold 106 and substrate 102, and is generally as small as 100 nm or less. Note that the distance (moving distance) across which the substrate stage 104 is moved is defined as a distance A. However, depending on, for example, the film thickness h of the resin R, the type of resin R, and the position of the shot region on the substrate 102, the moving distance of the substrate stage 104, which is required to align the mold 106 and substrate 102, is often as small as 10 nm or less.

Referring to FIG. 3, when the moving distance of the substrate stage 104 is the distance A, the relative distance, that is, the amount of position shift between the first mark MK1 and the second mark MK2 is Y1', which remains almost unchanged from the amount of position shift Y1 between the first mark MK1 and the second mark MK2, shown in FIG. 2. This is because when the moving distance of the substrate stage 104 is the distance A, the mold 106 (and the mold holding unit 108 which holds the mold 106) deforms due to the frictional force of the resin R with the film thickness h. Note that when the amount of position shift between the first mark MK1 and the second mark MK2 remains almost unchanged, the change in relative distance between the first mark MK1 and the second mark MK2 is smaller than $\frac{1}{10}$ of the moving distance of the substrate stage 104.

Figure 4:
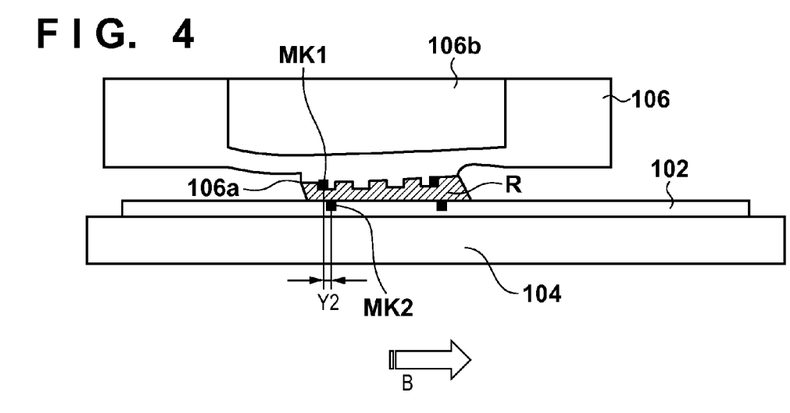
FIG. 4 is a schematic view showing the vicinities of the mold and substrate in the contact state between the resin and the mold in the imprint apparatus shown in FIG. 1.

FIG. 4 is a schematic view showing the vicinities of the mold 106 and substrate 102 when the substrate stage 104 is moved by a relatively long distance in the direction, in which the relative distance between the first mark MK1 and the second mark MK2 shortens, with respect to the positional relationship between the mold 106 and the substrate 102, shown in FIG. 2. The relatively long distance is, for example, from 100 nm to 2 μm, and the moving distance of the substrate stage 104 is defined as a distance B in this case. However, depending on, for example, the film thickness h of the resin R, the type of resin R, and the position of the shot region on the substrate 102, the moving distance of the substrate stage 104 is not limited to the range of 100 nm to 2 μm.

Referring to FIG. 4, when the moving distance of the substrate stage 104 is the distance B, an amount of position shift Y2 between the first mark MK1 and the second mark MK2 is smaller than the amount of position shift Y1 when the moving distance of the substrate stage 104 is the distance A, and falls within a tolerance. Also, the substrate stage 104 may be moved past the position at which the relative distance between the first mark MK1 and the second mark MK2 minimizes, that is, that at which the amount of position shift between the first mark MK1 and the second mark MK2 is zero. In this case, the direction in which the relative distance between the first mark MK1 and the second mark MK2 shortens can also be construed as that (first direction) in which the first mark MK1 and second mark MK2 come close to and then separate from each other. In this manner, by moving the substrate stage 104 by a relatively long distance (for example, the distance B), the change in relative distance between the first mark MK1 and the second mark MK2 can be set larger than $\frac{1}{10}$ of the moving distance of the substrate stage 104. In other words, by moving the substrate stage 104 by a relatively long distance, the distance between the first mark MK1 and the second mark MK2 can be considerably changed.

Figure 5:
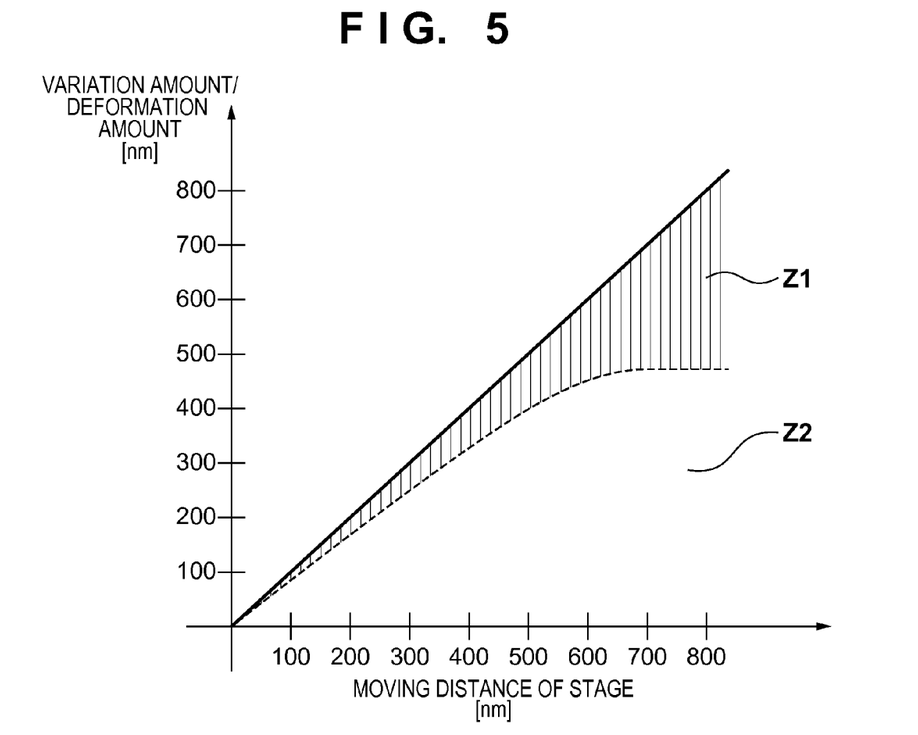
FIG. 5 is a graph showing the relationship between the variation amount of the distance between a first mark and a second mark as a function of the moving distance of a substrate stage, and the deformation amount of the mold as a function of the moving distance of the substrate stage.

On the other hand, when the substrate stage 104 is moved by the distance B, the mold 106 also deforms. FIG. 5 illustrates an example of the relationship between the variation amount of the distance between the first mark MK1 and the second mark MK2 as a function of the moving distance of the substrate stage 104, and the deformation amount of the mold 106 as a function of the moving distance of the substrate stage 104. FIG. 5 shows the moving distance of the substrate stage 104 (unit: nm) on the abscissa, and the variation amount of the distance between the first mark MK1 and the second mark MK2, and the deformation amount of the mold 106 (unit: nm) on the ordinate. Also, the variation amount of the distance between the first mark MK1 and the second mark MK2 is indicated by Z1, and the deformation amount of the mold 106 is indicated by Z2. As shown in FIG. 5, the mold 106 deforms as the substrate stage 104 moves, but the deviation of the deformation amount of the mold 106 becomes smaller than the moving deviation of the substrate stage 104 as the substrate stage 104 is moved by a relatively long distance. However, the relationship between the variation amount of the distance between the first mark MK1 and the second mark MK2 as a function of the moving distance of the substrate stage 104, and the deformation amount of the mold 106 as a function of the moving distance of the substrate stage 104 is not limited to that shown in FIG. 5. This is because this relationship depends on the film thickness h of the resin R, the type (frictional force) of resin R, and the material (structure) of the mold 106. Also, this relationship depends on, for example, the driving conditions, including the moving speed and trackability, of the substrate stage 104.

Figure 6:
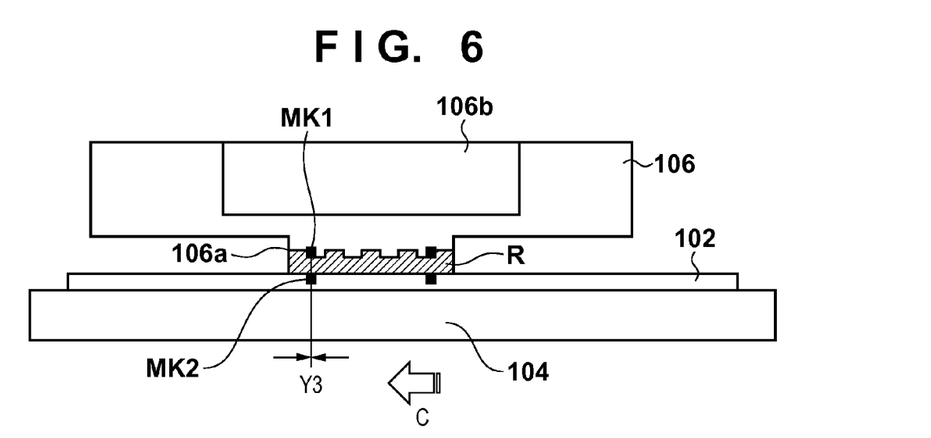
FIG. 6 is a schematic view showing the vicinities of the mold and substrate in the contact state between the resin and the mold in the imprint apparatus shown in FIG. 1.

FIG. 6 is a schematic view showing the vicinities of the mold 106 and substrate 102 when the substrate stage 104 is moved in a direction (second direction) opposite to the first direction with respect to the positional relationship between the mold 106 and the substrate 102, shown in FIG. 4. At this time, the distance across which the substrate stage 104 is moved is defined as a distance C smaller than the distance B. The second direction can also be construed as the direction in which the deformation amount of the mold 106 reduces upon movement of the substrate stage 104. However, if the direction in which the mold 106 deforms is not parallel to the moving direction of the substrate stage 104, the substrate stage 104 may be moved in the direction, in which the deformation amount of the mold 106 reduces, instead of in the second direction.

Also, the distance C across which the substrate stage 104 is moved is, for example, less than 100 nm. Therefore, even when the substrate stage 104 is moved, the relative distance between the first mark MK1 and the second mark MK2 remains almost the same (the change in relative distance between the first mark MK1 and the second mark MK2 is smaller than $\frac{1}{10}$ of the moving distance of the substrate stage 104). In other words, the deformation amount of the mold 106 can be reduced by moving the substrate stage 104 by the distance C. An amount of position shift Y3 between the first mark MK1 and the second mark MK2 after the substrate stage 104 is moved by the distance C is set equal to or smaller than the amount of position shift Y2 between the first mark MK1 and the second mark MK2, shown in FIG. 4. Since the deformation amount of the mold 106 is reduced by moving the substrate stage 104 by the distance C, it is possible not only to reduce the amount of position shift between the mold 106 and the substrate 102, but also to suppress deformation of each shot region on the substrate 102 due to deformation of the mold 106.

An imprint process in the imprint apparatus 1 will be described below with reference to FIG. 7. An imprint process is performed as the control unit 118 performs overall control of each unit of the imprint apparatus 1, as described above. In the imprint process according to this embodiment, in the contact state in which the mold 106 is kept in contact with the resin R on the substrate 102, the substrate stage 104 is moved and the mold 106 and substrate 102 are aligned, as described with reference to FIGS. 2, 4, and 6.

In step S702, the resin supply unit 112 supplies (applies) the resin R onto the substrate 102 (its shot region). More specifically, the substrate stage 104 is moved so that the substrate 102 is positioned below the resin supply unit 112, and the resin R is applied onto the substrate 102 by scan movement of the substrate stage 104 while the resin supply unit 112 supplies the resin R.

In step S704, the substrate stage 104 is moved so that the substrate 102 (more specifically, a region supplied with the resin R) is set at a position opposite to the pattern surface 106a of the mold 106 (that is, the position at which the mold 106 is brought into contact with the resin R). At this time, the first mark MK1 formed on the mold 106, and the second mark MK2 formed on the substrate 102 may be detected by the detection unit 116 to adjust the position of the substrate stage 104 so that the mold 106 and substrate 102 have a target positional relationship.

In step S706, the mold 106 is lowered by the mold holding unit 108 to bring the mold 106 into contact with the resin R on the substrate 102 (that is, the mold 106 is pressed against the resin R on the substrate 102).

In step S708, the first mark MK1 formed on the mold 106, and the second mark MK2 formed on the substrate 102 are detected by the detection unit 116 to obtain the amount of position shift between the first mark MK1 and the second mark MK2 (that is, the amount of position shift between the mold 106 and the substrate 102).

In step S710, it is determined whether the amount of position shift between the first mark MK1 and the second mark MK2, which is obtained in step S708, falls within a tolerance. The tolerance of the amount of position shift between the first mark MK1 and the second mark MK2 is set in accordance with the performance (specification) obtained for the imprint apparatus 1, and set to, for example, 10 nm. If the amount of position shift between the first mark MK1 and the second mark MK2 does not fall within the tolerance, the process proceeds to step S712. However, if the amount of position shift between the first mark MK1 and the second mark MK2 falls within the tolerance, the process proceeds to step S716.

In step S712, the substrate stage 104 is moved by a relatively long distance in the direction (first direction) in which the first mark MK1 and second mark MK2 come close to and then separate from each other (first process), as shown in FIG. 4. For example, the substrate stage 104 is moved using, as a target moving distance, a distance obtained by adding to the moving distance of the substrate stage 104, which is required to align the mold 106 and substrate 102, an additional distance determined in accordance with the amount of position shift between the first mark MK1 and the second mark MK2.

In step S714, the substrate stage 104 is moved by a relatively short distance in a second direction opposite to the first direction (second process), as shown in FIG. 6. Note that the substrate stage 104 is moved by a distance smaller than the target moving distance determined in accordance with the additional distance added in step S712.

In step S716, the resin R on the substrate 102 is cured in the contact state in which the mold 106 is kept in contact with the resin R. More specifically, the resin R on the substrate 102 is cured by irradiating it with light from the light source 114 through the mold 106.

In step S718, the mold 106 is lifted by the mold holding unit 108 to release the mold 106 from the resin R cured by light irradiation. With this operation, the pattern of the mold 106 is formed (transferred) upon the resin R on the substrate 102.

With this arrangement, in this embodiment, the mold 106 and substrate 102 are aligned by a first process (step S712) and a second process (step S714) (that is, reciprocal movement of the substrate stage 104) in the contact state in which the mold 106 is kept in contact with the resin R. Hence, the imprint apparatus 1 can align the mold 106 and substrate 102 with high accuracy while suppressing deformation of the mold 106 even under the influence of, for example, the frictional force of the resin R.

Figure 7:
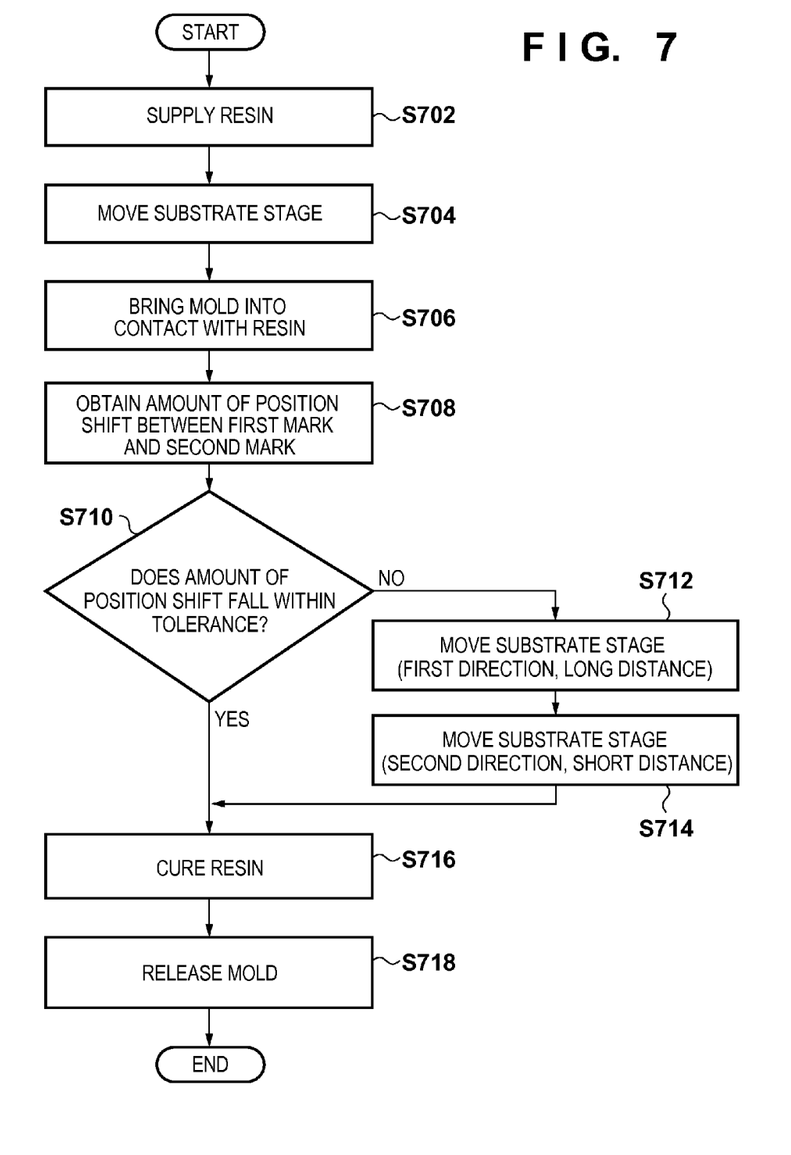
FIG. 7 is a flowchart for explaining an imprint process in the imprint apparatus shown in FIG. 1.
Figure 8:
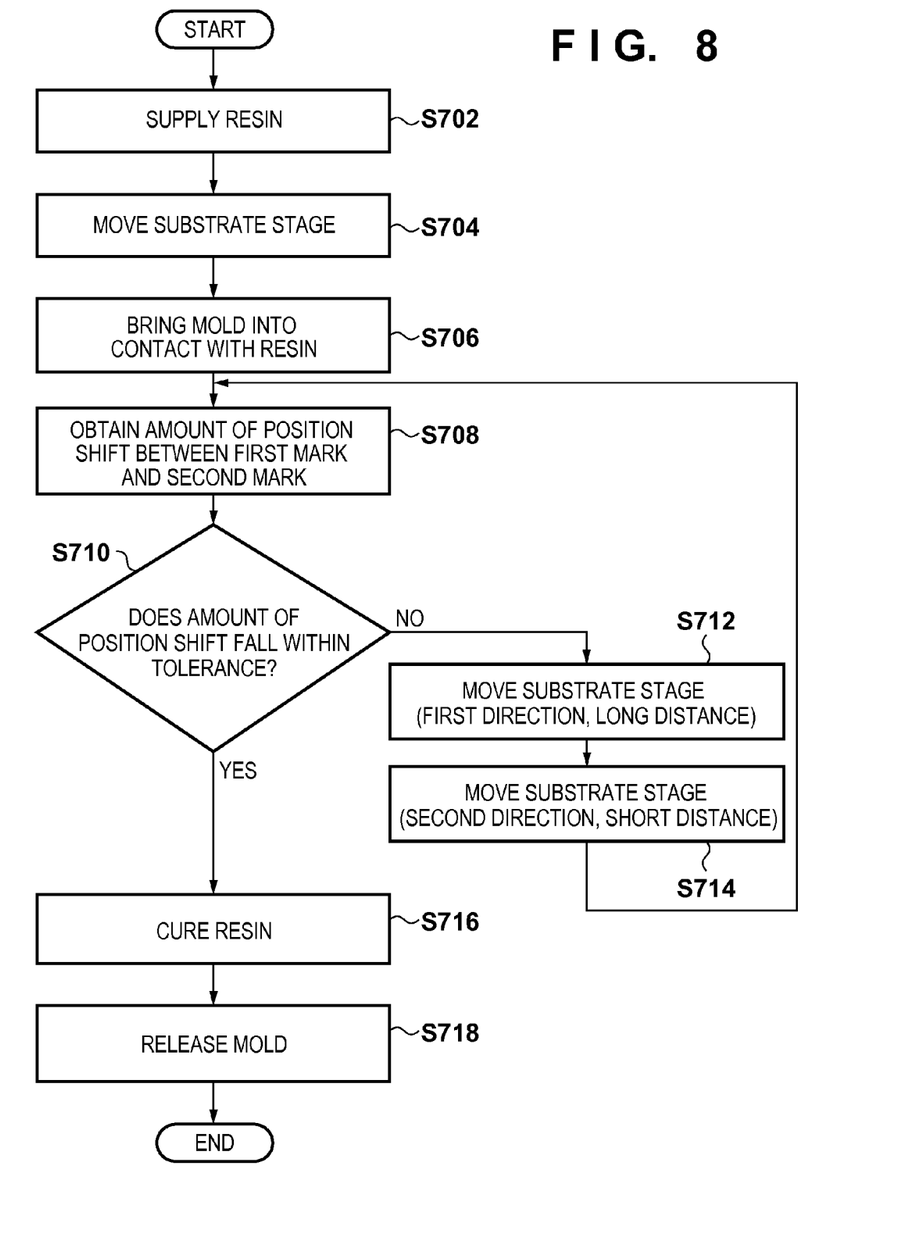
FIG. 8 is a flowchart for explaining another imprint process in the imprint apparatus shown in FIG. 1.

Also, referring to FIG. 7, after the first and second processes, curing of the resin R (step S716), and release of the mold 106 (step S718) are performed without determining whether the amount of position shift between the first mark MK1 and the second mark MK2 falls within the tolerance. This is because the amount of position shift between the first mark MK1 and the second mark MK2 is regarded to fall within the tolerance as long as first and second processes are performed once. However, in practice, it is often the case that the amount of position shift between the first mark MK1 and the second mark MK2 does not fall within the tolerance when first and second processes are performed only once. In such a case, as shown in FIG. 8, after the first and second processes, it may be determined whether the amount of position shift between the first mark MK1 and the second mark MK2 falls within the tolerance to repeat first and second processes until this amount of position shift falls within the tolerance.

However, after the first and second processes, if it is not determined whether the amount of position shift between the first mark MK1 and the second mark MK2 falls within the tolerance (FIG. 7), it is desired to obtain the relationship shown in FIG. 5 in advance, and store it in a storage unit such as the memory 118b. The relationship shown in FIG. 5 depends on the film thickness h of the resin R, the type of resin R, and the material of the mold 106, as described above. Therefore, a storage unit such as the memory 118b stores information indicating the relationship shown in FIG. 5 for each combination of the film thickness h of the resin R, the type of resin R, and the material of the mold 106. The control unit 118 determines an additional distance in the first process, and a distance smaller than the target moving distance in the second process, based on the information which indicates the relationship shown in FIG. 5 and is stored in the storage unit, and the amount of position shift between the first mark MK1 and the second mark MK2. With this operation, the amount of position shift between the first mark MK1 and the second mark MK2 can be made to fall within the tolerance by performing first and second processes only once.

Also, the storage unit such as the memory 118b rewritably stores the information indicating the relationship shown in FIG. 5, and rewrites it in exchanging the mold 106. With this operation, the control unit 118 can determine an additional distance in the first process, and a distance smaller than the target moving distance in the second process, in accordance with the mold 106.

Figure 9:
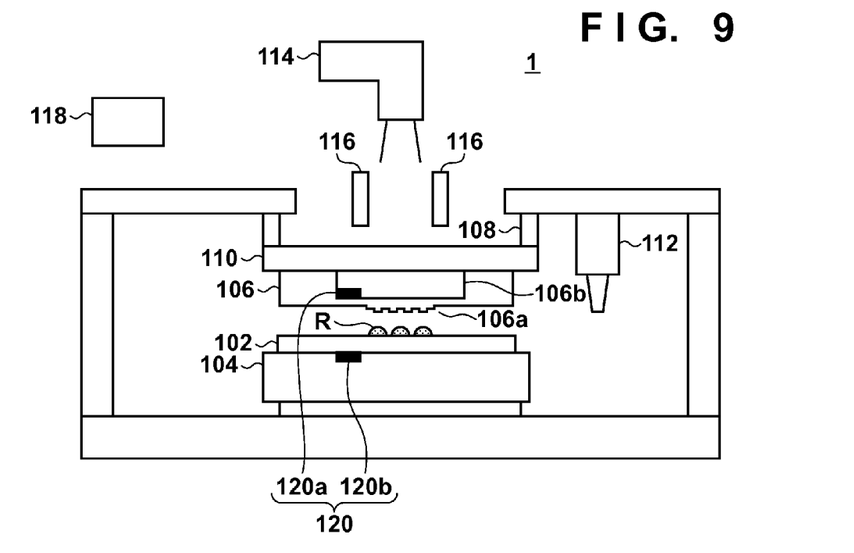
FIG. 9 is a schematic view showing the configuration of an imprint apparatus according to another aspect of the present invention.
Figure 10:
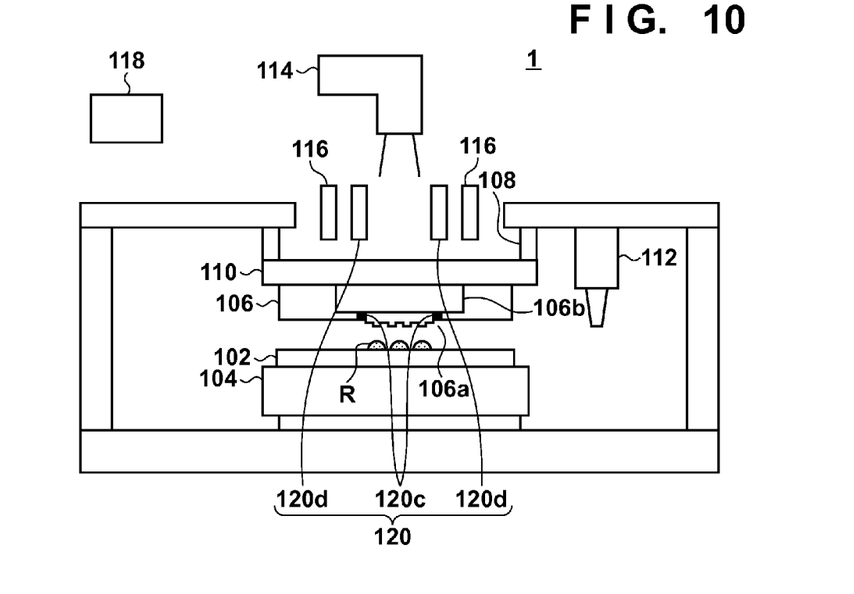
FIG. 10 is a schematic view showing the configuration of an imprint apparatus according to still another aspect of the present invention.

The imprint apparatus 1 often includes a measuring unit 120 which measures the deformation amount of the mold 106, as shown in FIGS. 9 and 10. In such a case, a distance smaller than the target moving distance in the second process can be determined based on the deformation amount of the mold 106 measured by the measuring unit 120, and the amount of position shift between the first mark MK1 and the second mark MK2.

Referring to FIG. 9, the measuring unit 120 includes a deformation gauge 120a disposed on the mold 106 or mold holding unit 108 (mold chuck 110), and a deformation gauge 120b disposed on the substrate stage 104. However, a deformation gauge need not always be disposed on each of the mold 106 and the substrate stage 104, and need only be disposed on either of them. Also, a deformation gauge is set in a portion where the mold 106 is prone to deformation, for example, part of the cavity 106b of the mold 106.

On the other hand, referring to FIG. 10, the measuring unit 120 includes a deformation measurement mark 120c formed on the mold 106, and an image sensing system 120d which senses the deformation measurement mark 120c, and obtains the deformation amount of the mold 106 based on the deformation measurement mark 120c sensed by the image sensing system 120d. The deformation measurement mark 120c is formed in a portion where the mold 106 is prone to deformation, for example, part of the cavity 106b of the mold 106. Also, the deformation measurement marks 120c may be formed in a plurality of portions (positions) of the mold 106, as shown in FIG. 10.

Further, the measuring unit 120 is not limited to the configuration shown in FIG. 9 or 10, and need only be able to measure the deformation amount of the mold 106. For example, the measuring unit 120 may include an interferometer which measures the distance between the mold 106 and a reference surface, and obtain the deformation amount of the mold 106 based on the distance measured by the interferometer.

An imprint process in the imprint apparatus 1 shown in FIG. 9 or 10 will be described with reference to FIG. 11. Note that a series of processes after the resin R is supplied onto the substrate 102 by the resin supply unit 112 until it is determined whether the amount of position shift between the first mark MK1 and the second mark MK2 falls within the tolerance (steps S702 to S710) is as described above.

In step S712, the substrate stage 104 is moved by a relatively long distance in a first direction in which the first mark MK1 and second mark MK2 come close to and then separate from each other (first process), as described above.

In step S722, after the substrate stage 104 is moved in step S712, the deformation amount of the mold 106 is measured by the measuring unit 120. More specifically, the measuring unit 120 measures the deformation amount of the mold 106 with respect to its reference shape. The reference shape of the mold 106 need only be measured, for example, at the time of exchange of the mold 106, or before or after the mold 106 is brought into contact with the resin R.

In step S724, the substrate stage 104 is moved by a relatively short distance in a second direction opposite to the first direction (second process). Note that the distance smaller than the target moving distance determined in accordance with the additional distance added in step S712 is adjusted based on the deformation amount of the mold 106 measured in step S722, and the amount of position shift obtained in step S708, and the substrate stage 104 is moved. More specifically, the substrate stage 104 is moved to reduce both the deformation amount of the mold 106, and the amount of position shift between the first mark MK1 and the second mark MK2.

With this arrangement, while suppressing deformation of the mold 106 upon movement of the substrate stage 104, steps S708, S710, S712, S722, and S724 are repeated until the amount of position shift between the first mark MK1 and the second mark MK2 falls within the tolerance. When the amount of position shift between the first mark MK1 and the second mark MK2 falls within the tolerance, curing of the resin R (step S716), and release of the mold 106 (step S718) are performed, as described above.

Figure 11:
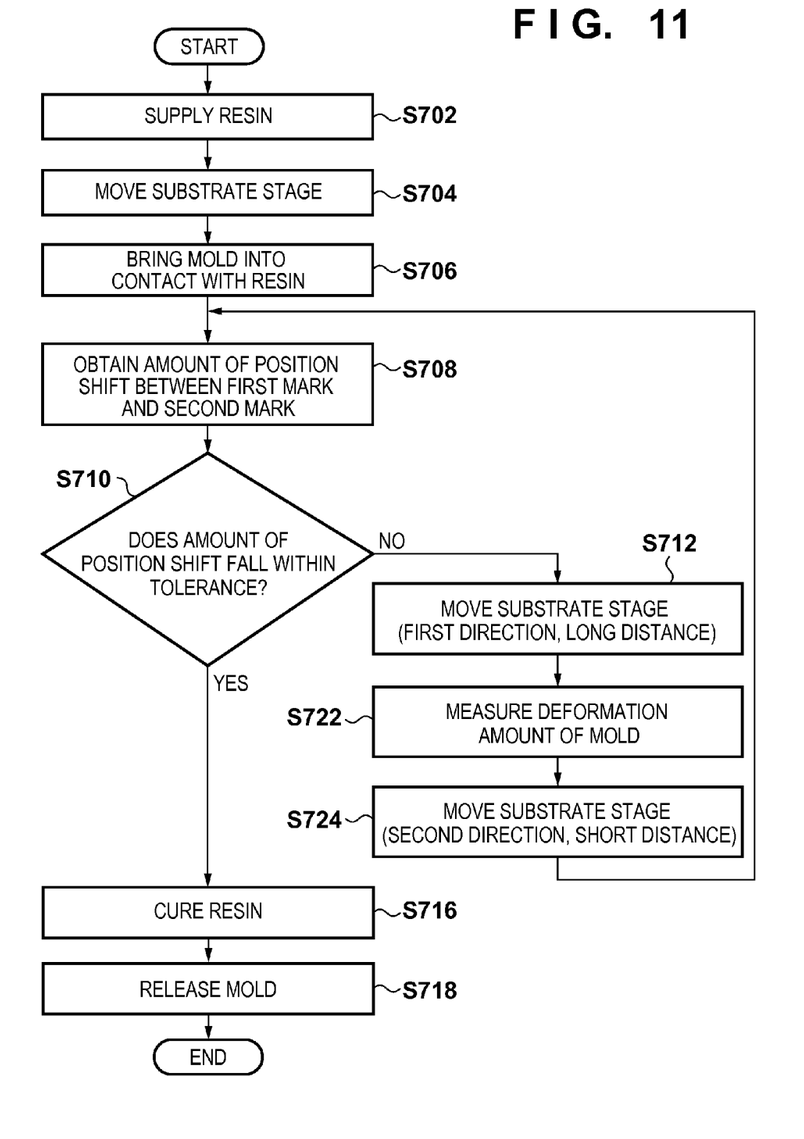
FIG. 11 is a flowchart for explaining an imprint process in the imprint apparatus shown in FIG. 9 or 10.

The imprint apparatus 1 shown in FIG. 9 or 11 can align the mold 106 and substrate 102 with high accuracy while effectively suppressing deformation of the mold 106 in the contact state in which the mold 106 is kept in contact with the resin R.

As described above, since the imprint apparatus 1 can align the mold 106 and substrate 102 with high accuracy, it can provide a high-quality article such as a semiconductor device with a high throughput and good economic efficiency. A method of manufacturing a device (for example, a semiconductor device, a magnetic storage medium, or a liquid crystal display device) as an article will be described. The manufacturing method includes a step of transferring (forming) a pattern onto a substrate (for example, a wafer, a glass plate, or a film-like substrate) using the imprint apparatus 1. The manufacturing method further includes a step of etching the substrate having the pattern transferred onto it. Note that in manufacturing other articles such as pattern dot media (recording media) or optical devices, the manufacturing method includes other processing steps of processing the substrate having the pattern transferred onto it, in place of an etching step.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-116914 filed on May 22, 2012, which is hereby incorporated by reference herein in its entirety.

What is claimed is:

1. An imprint apparatus which performs an imprint process in which a resin on a substrate is cured, in a contact state in which a mold is kept in contact with the resin, to transfer a pattern onto the substrate, the apparatus comprising:
   a stage configured to move upon holding the substrate;
   a detection unit configured to detect a first mark formed on the mold, and a second mark formed on the substrate; and
   a processing unit configured to perform alignment of the mold and the substrate in the contact state,
   wherein the processing unit performs the alignment by a first process of moving the stage in a first direction in which the first mark and the second mark come close to using, as a target moving distance, a distance obtained by adding to a moving distance of the stage, which is required for the alignment, an additional distance determined in accordance with an amount of position shift between the first mark and the second mark detected by the detection unit, and a second process of moving the stage in a second direction opposite to the first direction by a distance smaller than the target moving distance determined in accordance with the additional distance after the first process.

2. The apparatus according to claim 1, wherein
   a distance between the first mark and the second mark varies as the stage moves in the contact state,
   the apparatus further comprises a storage unit configured to store information indicating a relationship between a variation amount of the distance between the first mark and the second mark as a function of the moving distance of the stage in the contact state, and a deformation amount of the mold as a function of the moving distance of the stage in the contact state, and
   the processing unit determines the additional distance and the distance smaller than the target moving distance, based on the amount of position shift and the information stored in the storage unit.

3. The apparatus according to claim 2, wherein the storage unit stores the information for each combination of a thickness of the resin in the contact state, a type of the resin, and a material of the mold.

4. The apparatus according to claim 2, wherein the storage unit
   rewritably stores the information, and
   rewrites the information, stored in the storage unit, in exchanging the mold.

5. The apparatus according to claim 1, further comprising:
   a measuring unit configured to measure a deformation amount of the mold, wherein the processing unit determines the distance smaller than the target moving distance, based on the amount of position shift and the deformation amount of the mold measured by the measuring unit.

6. The apparatus according to claim 5, wherein the measuring unit includes a deformation gauge disposed on one of the mold and a holding unit configured to hold the mold.

7. The apparatus according to claim 5, wherein the measuring unit
includes
a deformation measurement mark formed on the mold, and
an image sensing system configured to sense the deformation measurement mark, and
obtains a deformation amount of the mold based on the deformation measurement mark sensed by the image sensing system.

8. The apparatus according to claim 5, wherein the measuring unit includes an interferometer configured to measure a distance between the mold and a reference surface, and obtains a deformation amount of the mold based on the distance measured by the interferometer.

9. An imprint method of performing an imprint process in which a resin on a substrate held by a stage is cured, in a contact state in which a mold is kept in contact with the resin, to transfer a pattern onto the substrate, the method comprising:
a step of detecting a first mark formed on the mold, and a second mark formed on the substrate; and
a step of performing alignment of the mold and the substrate in the contact state,
wherein the alignment is performed by a first process of moving the stage in a first direction in which the first mark and the second mark come close to and then separate from each other using, as a target moving distance, a distance obtained by adding to a moving distance of the stage, which is required for the alignment, an additional distance determined in accordance with an amount of position shift between the detected first mark and the detected second mark, and a second process of moving the stage in a second direction opposite to the first direction by a distance smaller than the target moving distance determined in accordance with the additional distance after the first process.

10. A method of manufacturing an article, the method comprising:
a step of using an imprint apparatus to form a pattern on a substrate; and
a step of processing the substrate with the pattern,
wherein the imprint apparatus performs an imprint process in which a resin on the substrate is cured, in a contact state in which a mold is kept in contact with the resin, to transfer a pattern onto the substrate, and includes:
a stage configured to move upon holding the substrate;
a detection unit configured to detect a first mark formed on the mold, and a second mark formed on the substrate; and
a processing unit configured to perform alignment of the mold and the substrate in the contact state,
wherein the processing unit performs the alignment by a first process of moving the stage in a first direction in which the first mark and the second mark come close to using, as a target moving distance, a distance obtained by adding to a moving distance of the stage, which is required for the alignment, an additional distance determined in accordance with an amount of position shift between the first mark and the second mark detected by the detection unit, and a second process of moving the stage in a second direction opposite to the first direction by a distance smaller than the target moving distance determined in accordance with the additional distance after the first process.

* * * * *